MULTIPLE-FREQUENCY GENERATORS
Filed Aug. 19, 1963
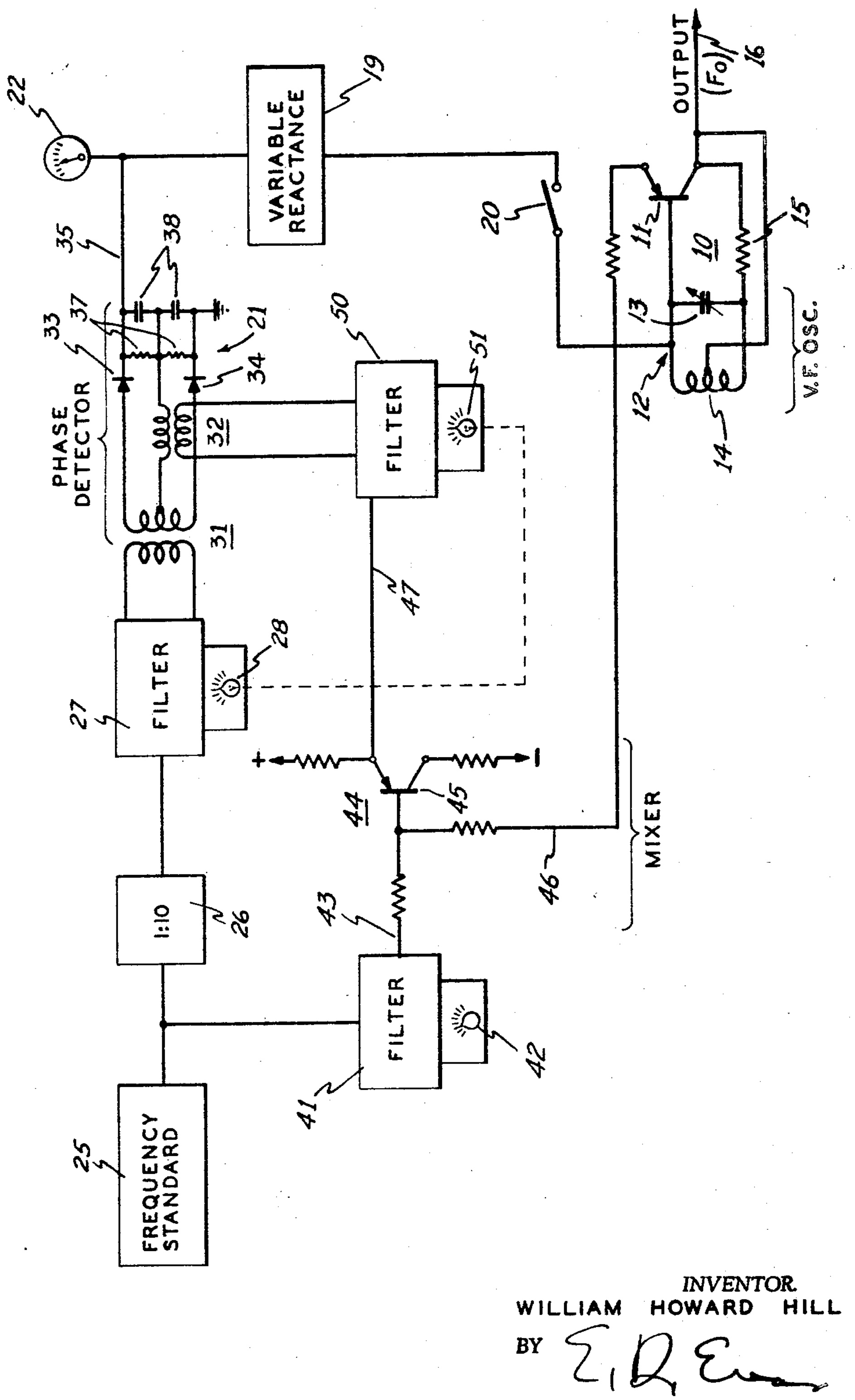
INVENTOR.
WILLIAM HOWARD HILL
BY E. R. Evans
ATTORNEY United States Patent Office 3,398,377

Patented Aug. 20, 1968

3,398,377
MULTIPLE-FREQUENCY GENERATORS

William Howard Hill, Yonkers, N.Y., assignor to Litton Systems, Inc., Beverly Hills, Calif.

Filed Aug. 19, 1963, Ser. No. 302,944
6 Claims. (Cl. 331—16)

This invention relates to frequency generators or synthesizers, capable of generating a plurality of precise predetermined frequencies.

An object of the invention is to provide a frequency generator capable of adjustment for manual selection of desired frequencies in relatively small steps over a wide frequency range; in other words, output frequencies where the rigorously controlled steps in frequency are relatively small compared to the average output frequency of the generator.

Another object of the invention is to simplify the construction of a frequency generator or synthesizer while maintaining precise frequency control and desired reliability of operation.

A further object of the invention is to generate selectively a plurality of closely spaced stable-frequency output currents from a variable-frequency oscillator and a primary frequency standard of rigorously controlled frequency by deriving a series of frequencies from said primary standard, spaced apart by an amount equal to the desired spacing between said output current frequencies, deriving a frequency substantially equal to a selected one of said series of frequencies by mixing the output frequency of the VFO with a frequency derived from said primary standard, and locking in said VFO to the desired output frequency by means including a phase detector arranged to respond to the phase difference between the selected one of said series of frequencies and the substantially equal frequency derived in part from the VFO.

Other objects of the invention, together with the outstanding features and advantages thereof, will become apparent from the following description of the illustrative embodiment shown in the accompanying drawing, the single figure of which is a schematic view, partially in diagrammatic form, of a frequency generator capable of being varied over a wide range of frequencies in relatively small steps.

Referring to the drawing, the system shown embodying the invention in one form comprises a variable frequency oscillator 10 for generating the output frequency $F_0$, said oscillator being continuously variable over the desired range of output frequencies. The average output frequency $F_0$ may be of the order of 50 kc., for example. The oscillator 10 may be of a conventional type and as shown, comprises a transistor 11, a resonant circuit 12 for tuning the oscillator which includes a variable capacitor 13 and an inductance 14, said circuit being connected to the collector electrode of transistor 11 through a resistor 15. A tap on the inductance 14 is connected to the output conductor 16 as shown. A variable reactance 19 is employed to control the oscillator frequency when the switch 20 is closed in a manner to be described below.

A phase detector 21 is arranged to generate a potential for controlling the variable reactance 19 when the adjusted frequency of the oscillator 10 is not exactly the desired frequency, the phase detector 21 and a voltmeter 22 being employed to compare and control the output frequency utilizing a reference frequency obtained from a frequency standard 25, constituting a source of rigorously fixed frequency which is relatively low compared to the output frequency $F_0$. Since the desired steps in frequency of the output frequency are small, for example 100 cycles, the frequency of the frequency standard 25 is also relatively low, for example of the order of 1000 cycles, which means that the output frequency $F_0$ cannot be easily derived from harmonics of the standard frequency or a sub-multiple of the standard frequency, which is the normal method of deriving a series of output frequencies from a primary standard. In accordance with the invention, the problems involved in such a method are overcome.

In order to control the reactance 19 by means of the phase detector 21, the frequency standard 25, having an output frequency for example of one kc., is connected to a frequency divider 26 having an output current of a frequency equal to the separation desired between the output frequencies $F_0$, say 100 cycles. It will be understood that the output currents of the frequency standard 25 and the frequency divider 26 are rich in harmonics. The frequency divider 26 is connected to a narrow band-pass filter 27 which is adjustable by means of a rotary switch 28, to select a plurality of frequencies separated by 100 cycles. Thus the output of the filter 27, depending upon the adjustment of the switch 28, may for example be 1 kc., 1.1 kc., 1.2 kc.–1.9 kc.; or in other words the tenth through the nineteenth harmonics of the output current from the divider 26. As shown the output frequency of the filter 27 is coupled through the transformer 31 to the phase comparator or detector circuit 21. The phase detector circuit may be of a conventional dual-input type in which two input transformers 31 and 32 are connected in opposition to rectifiers 33 and 34 so that when the detector input currents through the secondary windings of the transformers 31 and 32 are of the same amplitude and frequency, the circuit is balanced and no current flows through the rectifiers. The comparator or detector circuit 21, being untuned, is not subject to the error or faulty response that would result from frequency drift in a tuned circuit. If however the frequency of one input current is greater or less than the other, a DC potential is impressed upon the output conductor 35, the magnitude and polarity of which depend upon the amplitude and direction of the difference between the input frequencies. As shown the rectifiers 33 and 34 may be shunted by resistors 37 and capacitors 38 to filter out any ripple in the output current. The conductor 35 is connected to the variable reactance 19 which is effective to correct the frequency of the oscillator 10 in the usual manner.

The squared output current from the frequency standard 25 is also connected to a second adjustable filter 41 having a manual control switch 42, said filter being adjustbale for example in one kc. increments. The output frequencies from the filter 41 are of the same order as the output frequencies $F_0$ but in the case of the frequencies stated above for purposes of explanation, are of slightly lower frequency and correspond to selected harmonics of the frequency output of one kc. from the frequency standard 25. The output of the filter 41 is connected through conductor 43 to a mixer or modulator 44. The mixer 44 may be of any conventional type and is shown as comprising a transistor 45, the base of which is connected to the conductor 43 and to a second conductor 46 through which current is supplied from the variable frequency oscillator 10. The mixer 44 thus produces an output current in the conductor 47 containing the sum and difference frequencies of the currents supplied through the conductors 43 and 46.

The conductor 47 is connected to a third narrow-band filter 50 provided with a frequency selector switch 51, said filter being identical with the filter 27. As shown the filters 27 and 50 are ganged together so that in any position of the selector switches 28 and 51, the same output frequencies will appear in the outputs from the filters.

A desired output frequency $F_0$ is selected by adjusting the filters 27, 41 and 50 to the desired values and then adjusting the capacitor 13 in the variable frequency oscillator 10 for the desired output $F_0$. The phase detector 21 locks in the variable frequency oscillator 10 to maintain the output frequency precisely at the desired value through the control device represented by variable reactance 19. Thus assuming that it is desired to generate output currents which vary in 100 cycle increments, the filters 27 and 50 are tunable over a one kc. range in 100-cycle steps; the filter 41 is tunable over the desired output range of $F_0$ in one kc. steps. When the variable frequency oscillator 10 is adjusted to the desired frequency, the output current selected by the filter 50 from the frequencies flowing in conductor 47 will be exactly the same as the frequency selected by the filter 27 and impressed upon the phase detector 21. In order to obtain this adjustment the switch 20 is opened and the capacitor 13 varied until it reaches the approximately correct position where the difference in frequencies will produce pulsations of the voltage in the conductor 35 at a slow rate which can be observed by the fluctuations of the pointer of the voltmeter 22. Then the switch 20 is closed to lock in the oscillator 10 at the desired frequency. A current of predetermined frequency which is variable in small steps is thus provided by the oscillator 10 and the current source may be used as a local oscillator in a radio receiver, as the exciter source for a radio transmitter or for any other desired purpose. By way of illustration, if the desired output frequency $F_0$ is 41.3 kc., the output of filters 27 and 50 may be 1.3 kc., and of filter 41, 40 kc.

It will be seen that the frequency of the output current $F_0$ is fixed by the frequency standard 25 to give a precise controlled frequency. However, the alternating current output is derived from the oscillator 10 which provides ample power and a wave shape which is free from phase modulation or other distortion at all delivered frequencies. In this respect the system embodying the invention is superior to prior systems which attempted to generate a number of closely spaced frequencies from relatively high harmonics of an oscillator or other source of constant-frequency current.

It is therefore a principal feature of the invention that a plurality of frequencies which are closely spaced in relation to the average frequency involved are employed to lock in a VFO which can be readily adjusted to approximately any one of the desired output frequencies, say 50, 50.1, 50.2 kc. Since it is impractical to synthesize such closely spaced frequencies from a single primary lower frequency oscillator, on account of the specialized character of the mixer and filters that would be essential for reliable operation, it has been proposed to employ a plurality of primary sources or oscillators. It has also been proposed to provide a high-frequency source and pulse-counting technique to obtain a series of closely spaced pulsating output currents. It is obvious that systems of this character are undesirably complex. The system described embodying the invention has the further advantage that any one of a large number of closely spaced frequencies may be readily selected by adjustment of the selective filters 27, 41 and 50, and adjusting the VFO 10 by reference to the indicating voltmeter 22.

It is to be understood that the above described arrangement illustrates the application of the principles of the invention and numerous other arrangements within the scope of the invention may be devised by those skilled in the art. Thus, by way of example and not of limitation, other equivalent means for locking in the oscillator 10 to the control frequency may be employed, and other types of mixers and phase detectors may be used. Accordingly, from the foregoing, it is evident that various changes may be made in the system described for purposes of explanation without departing from the spirit of the invention as defined in the appended claims.

What is claimed is:

1. In a frequency synthesizer for generating a plurality of output frequencies, in combination,
a variable-frequency oscillator adjustable over the range of desired output frequencies,
means for generating a series of fixed lower frequencies *f* spaced by an amount equal to the desired spacing between the respective output frequencies,
a selectively adjustable filter connected to said means for selecting any desired frequency *f*,
means for generating a second frequency which differs from the desired output frequency by the selected frequency *f*,
a mixer for combining the second frequency with the output frequency of said variable-frequency oscillator, and
means connected to said filter and to said mixer for locking in said variable-frequency oscillator at the desired output frequency.

2. In a frequency synthesizer for generating a plurality of output frequencies, in combination,
a variable-frequency oscillator adjustable over the range of desired output frequencies of a predetermined order of magnitude,
a source of rigorously fixed lower frequency of a different order consisting of a frequency standard generating a constant output frequency of non-sinusoidal or squared wave shape,
a divider connected to said source to provide a series of fixed frequencies *f* spaced by an amount equal to the desired spacing between the respective output frequencies,
a selectively adjustable filter connected to said divider for selecting any desired frequency *f*,
means for deriving another constant frequency from said fixed frequency source which other frequency differs from the desired output frequency by the selected desired frequency *f*,
means including a mixer and a second filter, said mixer being connected to said last-mentioned constant-frequency deriving means and to said variable-frequency oscillator, and said second filter being connected to the output of said mixer, to generate a frequency equal to the selected frequency *f* when said variable-frequency oscillator is adjusted to the desired output frequency, and
means including a phase detector connected to said first-mentioned filter and to said second filter for locking in said variable frequency oscillator at the desired output frequency.

3. In a frequency synthesizer for generating a plurality of output frequencies, in combination,
a variable-frequency oscillator adjustable over the range of desired output frequencies,
means comprising a frequency standard of rigorously fixed frequency output for generating a series of fixed frequencies *f* spaced by an amount equal to the desired spacing between the respective output frequencies,
a first selectively adjustable filter connected to said means for selecting any desired frequency *f*,
means for generating a second frequency which differs from the desired output frequency by the selected frequency *f*,
means including a mixer and a second adjustable filter, said mixer being connected to said means for generating a second frequency and to said variable-frequency oscillator, and said second filter being connected to the output of said mixer, to generate said selected frequency *f* when said variable-frequency oscillator is adjusted to the desired output frequency, and
means connected to said first filter and to said second filter for locking in said variable-frequency oscillator at the desired output frequency.

4. In a system for generating a plurality of output frequencies, in combination, an output circuit, a variable-frequency oscillator adjustable over the range of desired output frequencies, said variable-frequency oscillator being connected to said output circuit, and means for locking in said variable-frequency oscillator to a desired output frequency, said means comprising a frequency standard, and means connected to said frequency standard for selectively deriving a series of lower frequencies $f$ spaced by an amount equal to the desired spacing between the respective output frequencies, and means connected to said frequency standard for generating a second frequency which differs from the desired output frequency by a selected frequency $f$, and a mixer connected to said last-mentioned means and to said variable-frequency oscillator to generate a predetermined frequency $f$ when said variable-frequency oscillator is adjusted to the desired output frequency, and means including a phase detector responsive to the frequency $f$ derived from the frequency standard and to the frequency $f$ in the output circuit of said mixer for locking in said variable-frequency oscillator at the desired output frequency.

5. In a system for generating a plurality of output frequencies, in combination, an output circuit, a variable-frequency oscillator adjustable over the range of desired output frequencies, said oscillator being connected to said output circuit, a frequency standard generating a current of rigorously fixed frequency, means consisting of a frequency divider and a first adjustable filter connected in series relation to said frequency standard to generate a series of frequencies $f$ spaced by an amount equal to the desired spacing between the respective output frequencies, and select any one desired frequency $f$, a phase comparator having an input connected to said adjustable filter, and a second input, and an output for locking in said variable-frequency oscillator to the desired output frequency, means for deriving a frequency from the variable-frequency oscillator, by adjustment thereof before it is locked in, approximately equal to the selected frequency $f$, said last-mentioned means including a second adjustable filter having its output connected to the second input of said phase comparator, and means to apply the output voltage of said phase comparator to lock in the variable-frequency oscillator at the desired output frequency.

6. In a system for generating a plurality of output frequencies, in combination, an output circuit, a variable-frequency oscillator adjustable over the range of desired output frequencies, said oscillator being conected to said output circuit, a frequency standard generating a current of rigorously fixed frequency, means for generating a first plurality of frequencies harmonically related to the adjusted frequency of said oscillator, and a second plurality of frequencies harmonically related to the fixed frequency of said frequency standard, means including a phase comparator for locking in said variable-frequency oscillator at the desired output frequency, said phase comparator having an output circuit in which a control potential is produced upon the occurrence of phase difference in the input thereto, means for supplying currents to the input of said phase comparator, comprising filtering means for selecting one of said first plurality of frequencies and one of said second plurality of frequencies, and an indicating voltmeter connected to said output circuit of the phase comparator, responsive to slow-rate pulsations in the potential of said circuit, to facilitate precise adjustment of said variable-frequency oscillator to enable locking in of the oscillator to the desired output frequency.

References Cited

UNITED STATES PATENTS

| | | | |
|---|---|---|---|
| 2,888,562 | 5/1959 | Robinson | 331—18 |
| 2,957,144 | 10/1960 | Huhn | 331—51 |
| 2,521,070 | 9/1950 | Lindner et al. | 331—30 |
| 3,032,650 | 5/1962 | Mathison et al. | 331—30 |

JOHN KOMINSKI, *Primary Examiner.*